(12) United States Patent
Bertram et al.

(10) Patent No.: US 8,809,192 B2
(45) Date of Patent: Aug. 19, 2014

(54) METHOD FOR DEPOSITION OF AT LEAST ONE ELECTRICALLY CONDUCTING FILM ON A SUBSTRATE

(75) Inventors: Dietrich Bertram, Aachen (DE); Jochen Hugo Stollenwerk, Maastricht (NL); Johannes Krijne, Best (NL); Holger Schwab, Aachen (DE); Edward Willem Albert Young, Maastricht (NL); Jeroen Henri Antoine Maria Van Buul, Budel (NL); Andres Gasser, Aachen (DE); Konrad Wissenbach, Herzogenrath (DE); Christian Vedder, Aachen (DE); Norbert Pirch, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 285 days.

(21) Appl. No.: 13/143,940

(22) PCT Filed: Jan. 11, 2010

(86) PCT No.: PCT/IB2010/050083
§ 371 (c)(1),
(2), (4) Date: Sep. 15, 2011

(87) PCT Pub. No.: WO2010/082151
PCT Pub. Date: Jul. 22, 2010

(65) Prior Publication Data
US 2011/0318924 A1 Dec. 29, 2011

(30) Foreign Application Priority Data
Jan. 14, 2009 (EP) .................................. 09150520

(51) Int. Cl.
*H01L 21/443* (2006.01)

(52) U.S. Cl.
USPC .................... 438/679; 438/795; 257/E21.347

(58) Field of Classification Search
USPC ........................... 438/795, 679; 257/E21.347
See application file for complete search history.

(56) References Cited

U.S. PATENT DOCUMENTS

| 6,159,832 A | 12/2000 | Mayer |
| 6,717,650 B2 | 4/2004 | Jain |
| 7,384,530 B2 | 6/2008 | Cohen et al. |
| 2006/0086321 A1 | 4/2006 | Brody et al. |
| 2007/0099413 A1 | 5/2007 | Shiu et al. |
| 2008/0113292 A1 | 5/2008 | Matsuo |

FOREIGN PATENT DOCUMENTS

| EP | 1650046 A1 | 4/2006 |
| JP | 62142369 A | 6/1987 |
| JP | 06299339 A | 10/1994 |
| JP | 10022237 A | 1/1998 |

*Primary Examiner* — Zandra Smith
*Assistant Examiner* — Toniae Thomas
(74) *Attorney, Agent, or Firm* — Yuliya Mathis

(57) ABSTRACT

A method for deposition of at least one electrically conducting film on a substrate, wherein the method includes the steps of: selecting a layer of a film material, wherein the layer includes a mask on a front side, and wherein the layer and the mask are one piece; positioning the front side of the layer upon the substrate; applying at least one laser pulse onto a back side of the layer, so as to melt and to vaporize at least parts of the layer such that melt droplets are propelled toward and deposited upon the substrate; and forming the film, wherein at least one slot of the mask limits the distribution of the melt droplets.

10 Claims, 2 Drawing Sheets

METHOD FOR DEPOSITION OF AT LEAST ONE ELECTRICALLY CONDUCTING FILM ON A SUBSTRATE

FIELD OF THE INVENTION

This invention relates to a method for deposition of at least one electrically conducting film on a substrate.

BACKGROUND OF THE INVENTION

Many processing steps in semiconductor manufacture and micromachining require that a thin film of metal is deposited upon a surface in a controlled and precision manner. Thin electrically conducting films—also named interconnects—cover approximately 10% of the total surface of the substrate in OLED technology.

One method for depositing a thin metal film uses laser-thermal or photo-decomposition of organometallic gases above substrate surfaces. This continuous laser-thermal method is currently used for some metallization applications, yet in practice it suffers from at least three disadvantages. First, metal atoms generated in the gas phase above the substrate tend to spread over the surface away from the region of decomposition. Second, the process is relatively slow. Third, only those metals having an appropriate organometallic gas can be used. These problems make rapid, precise metallization by this method impractical for many microelectronics and microstructuring applications. Furthermore, this method inherently has an associated environmental problem of requiring safe handling and disposal of some toxic organometallic gases and structures.

In another method, the entire substrate surfaces are coated with the electrically conducting film material using the sputter method. Then wet chemical etching or an ablative laser method are used to expose the desired thin film geometry on the substrate. The etching solutions used however are problematic under toxicological and environmental protection aspects and, just like the proportions of the interconnect material which are deposited on machine components, can hardly be recycled.

A further method for producing electrical interconnects on surfaces is the laser sintering of nano-particles which in a dispersion are applied with an inkjet method. Neither the structure sizes and geometries nor the process speed with this method have been adequate for industrial mass production in OLED technology up to now. In addition, the substrate can be damaged by thermally induced cracks during the laser process.

SUMMARY OF THE INVENTION

Thus, the invention has for its object to eliminate the above mentioned disadvantages. In particular it is an object of the invention to provide a method to produce electrically conducting films on a substrate, making the production of these structures with widths of <100 μm and lengths of several hundred mm in mass production possible.

This object is achieved by a method as taught by claim 1 of the present invention. Advantageous embodiments of the method are defined in the sub claims, the following description or the exemplary embodiments.

This invention discloses a method for deposition of at least one electrically conducting film on a substrate, comprising the steps:

selecting a layer of a film material, wherein the layer comprises a mask on a front side and wherein the layer and the mask are one piece,
positioning the front side of the layer upon the substrate,
applying at least one laser pulse onto a back side of the layer, so as to melt and to vaporize at least parts of the layer such that melt droplets are propelled toward and deposited upon said substrate, forming the film, wherein at least one slot of the mask limits the distribution of said melt droplets.

The leading idea of the present invention is to use a layer of a film material, which comprises a mask, wherein the layer and the mask are one piece. The mask is used to limit the distribution of the melt droplets and therefore limits the size of the electrically conducting film deposited onto the substrate. The mask forms the front side of the layer. To achieve the aim of the invention the mask comprises contact areas and slots. The contact areas are in direct contact with the substrate, as the layer is positioned onto the substrate. The slots are formed into the layer as to limit the distribution of said melt droplets. The melting and vaporization itself is done by a laser pulse applied to the layer from a back side. Due to the transfer of energy by the laser pulse onto the back side of the layer, the layer is melted and vaporized and therefore propels the melt droplets towards the substrate by internally formed shock waves. For the formation of the pressure wave during the evaporation merely an adequate energy density has to be deposited in the layer. In the context of the invention a film denotes also to a texture or a structure of an electrically conducting material on a substrate.

Because of the additive nature of this method material is saved. The unused material can be reused. The method can be carried out in ambient air so that no high-vacuum processes are required. Furthermore, disposal costs are saved since no etching solutions have to be employed. The method can thus be employed in a resource-saving and cost-effective manner for mass production since it also makes high feed speeds or scan speeds of the laser beam during the production of the interconnects possible.

The proposed method cannot only be used for producing electrically conducting films but also for producing other type of lines of a material. In the following the invention is explained in more detail making reference to electrical conducting films however without restricting the method to such conducting films. It is obvious that the method is not restricted to electrically conductive material as line material.

In an advantageous embodiment the step applying of the method also comprises:

melting and vaporizing of at least parts of the layer,
generating a shockwave, expanding towards the substrate,
formation of an internal pressure wave towards the layer, and
propelling the melt droplets towards said substrate.

The layer material is partly being melted and vaporized by the induced laser beam energy. When the material evaporates a shockwave emerges from the melt surface and leaves a vacuum above the melt bath which induces a reversed internal pressure wave leading towards the molten surface. On impact droplets are struck clear from the molten layer and partly thrown upon the substrate's surface where they solidify instantly. The structuring on the front side of the layer forms a mask that canalises the vapour-melt-stream in order to form a desired defined structure like e.g. a conducting line upon the substrate's surface. Since this structure is a direct reproduction of the masking structure fine conducting textures of <100 μm in width can be reproduced upon the substrate. By adjusting laser processing parameters such as laser power, beam diameter, pulse duration, pulse repetition, scanning speed etc. a cutting front is being set with a certain angle that inhibits the laser radiation to hit the surface and destroy it.

In a preferred embodiment the method further comprises the step, that the shockwave is formed by a vaporised layer of the film material. The laser pulse evaporates a part of the layer which generates a shockwave that expands towards the substrate. The evaporation leads to a release of gas of the vaporised layer, which expands and thereby forms the shockwave. Within the borders of the shockwave a vacuum is generated, which in itself generates a pressure wave that is directed towards the starting point of the shockwave.

A preferred embodiment is characterized in that a plurality of laser pulses are applied sequentially and adjacent, preferred that the plurality of laser pulses move along the layer above the slot. The laser pulses may be moved along the layer with a defined feed speed.

A preferred embodiment is characterized in that
applying the laser pulse and/or the laser pulses to the layer forms a cutting edge, wherein the cutting edge comprises a cut angle θ of 30°≤θ≤70° relative to a back side of the layer.

The layer is provided with the slots and is placed with the front side onto the substrate and pressed onto the substrate during the subsequent laser processing. The laser beam and/or laser pulse is then applied to the layer from the back in such a manner that the layer material of the film melts locally. During the process of depositing the electrically conducting film on the substrate, the position of the laser pulse on the layer is moved. The speed with which the position of the laser pulse is changed, is called feed speed, and may be between 1 mm/sec and 10000 mm/sec. Due to this movement of the laser pulses and/or beam a cutting edge is established. The applying of the laser pulse to the layer leads to a melting and/or evaporating of the layer material, the concurrent forward movement of the laser pulse to an angle of the cutting edge. This angle should be chosen in such a way, that:
the laser pulse does not damage the substrate, and
the propelled melt droplets strike the substrate.

As measurements have shown, an even more preferred embodiment cutting edge comprises a cut angle θ of 45°≤θ≤60° relative to a back side of the layer.

With the proposed method layer material is provided on a substrate for producing electrical interconnects as a film. Therefore the layer material comprises a mask with a structured front, forming one or a plurality of slots. Structuring of the layer and/or the mask and/or the slot can for example be effected with a mechanical tool. Obviously the invention is not restricted to the type of creation of these slots however. The slots and/or the mask themselves preferentially have a rectangular cross section.

In a preferred embodiment a laser beam diameter on the back of the layer and/or a laser output parameters are adjusted in such a way that direct irradiation of the substrate is avoided. Thus, direct irradiation of the substrate by the laser is prevented. The substrate can therefore not be damaged by the laser pulse. By adjusting the laser beam diameter and/or output parameters of the laser, it is prevented that the laser beam injects energy into the film, deposited onto the substrate. Thereby it is prevented, that the film may evaporate again and the structure of the film is damaged.

In a preferred embodiment the substrate is an OLED substrate. The method has been especially effective, if OLEDs are used as a substrate, onto which conductive films are effective.

The object is solved by a layer of a film material wherein the layer comprises a mask and that the layer is usable according to anyone of the described methods. Features and details described with respect to the method also apply to the system and vice versa.

The object is also solved by a system for deposition of at least one electrically conducting film on a substrate, comprising a laser and a layer of a film material, wherein the system works accordingly to anyone of the described methods. Features and details described with respect to the methods also apply to the system and vice versa.

In a preferred embodiment the system comprises a laser that is a pulsed Nd:YVO$_4$-laser (neodymium-doped yttrium orthovanadate). Preferably the Nd:YVO$_4$-laser emits light with a wavelength of 1064 nm. In another advantageous embodiment the system is characterized in that the laser comprises an average output power between 10 and 100 Watt, preferably between 20 and 60 Watt. In another preferred embodiment the system is characterized in that the laser comprises a laser pulse repetition rate between 20 and 200 kHz, preferably between 110 and 170 kHz, preferably that the laser comprises a laser beam diameter between 10 to 100 μm, preferably between 20 and 50 μm. The length of each laser pulse may be between 40 and 60 ns.

The aforementioned method and/or layer of film and/or the system as well as claimed components and the components to be used in accordance with the invention in the described embodiments are not subject to any special exceptions with respect to size, shape and material selection. Technical concepts such that the selection criteria are known in the pertinent field can be applied without limitations. Additional details, characteristics and advantages of the object of the present invention are disclosed in the subclaims and the following description of the respective figures—which are an exemplary fashion only—showing a plurality of preferred embodiments of the method and/or the layer of film and/or the system according to the present invention.

BRIEF DESCRIPTION OF THE DRAWINGS

The proposed method is again explained in more details in the following by means of an exemplary embodiment in conjunction with the drawings. It is shown in schematic representation.

In the following the proposed method is explained once more by means of an example, wherein a film of copper is applied to a glass substrate 30.

Figure 1:
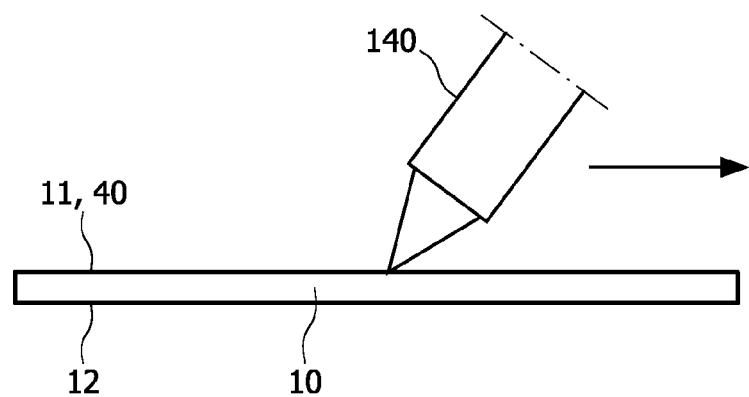
FIG. 1 an example of a layer, in which a slot is produced,
FIG. 2 an example of the layer of FIG. 1 with a mask, comprising the slot,
FIG. 3 a representation of the layer applied to a surface,
FIG. 4 a vertical cross section of FIG. 3 from which a cutting edge is evident,
FIG. 5 a schematic of the steps of the invented method, and
FIG. 6 a schematic of the applied film on the substrate in top view and in cross-sectional view.

In FIG. 1 a layer 10 of a film material is shown. It is the aim of the method to deposit at least parts of this film material onto a substrate 30. To achieve this aim, a slot 45 is inserted into the layer 10. In the present example a 45 μm thick copper layer 10 may be used. This copper layer 10 is subsequently processed with a mechanical tool 140, for example a tool with a diamond point in order to produce a slot 45 in a front of the copper layer having the width and the course of the film which shall be applied. In the present example the slot 45 may comprise a slot width 46 of 80 μm and a slot depth of 25 μm. In the context of the invention a film denotes also to a texture or a structure of an electrically conducting material on the substrate.

Figure 2:
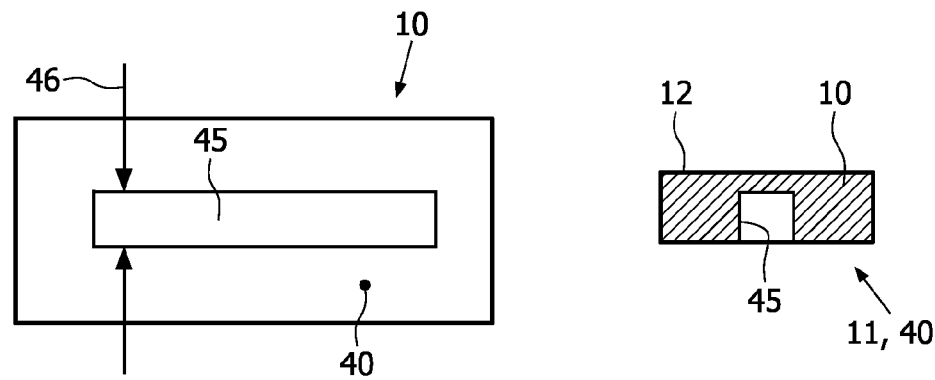

In FIG. 2 the layer 10 with the embedded slot 45 is shown. On the left side of FIG. 2 a view of the front side 11 of the layer 10 is shown. In the middle of the layer 10 the slot 45 has been implemented into the layer 10. On the right side of FIG. 2 a cross-sectional view of the layer 10 with its slot 45 is shown. The layer 10 comprises a front side 11. The parts of the front side 11 which are not taken away by the mechanical tool 140 form the mask 40. This mask 40 will be put upon the substrate 30, onto which the conductive film 20 shall be applied. The preferred rectangular cross-sectional shape of the slot 45 is evident in the cross-sectional view.

Merely the slot 45 having a straight-line course for creating a film 20 is shown in this example. It is obvious however that any slot structures can be produced in the front of the layer 10 with the method and any film structures can thus be created.

Figure 3:
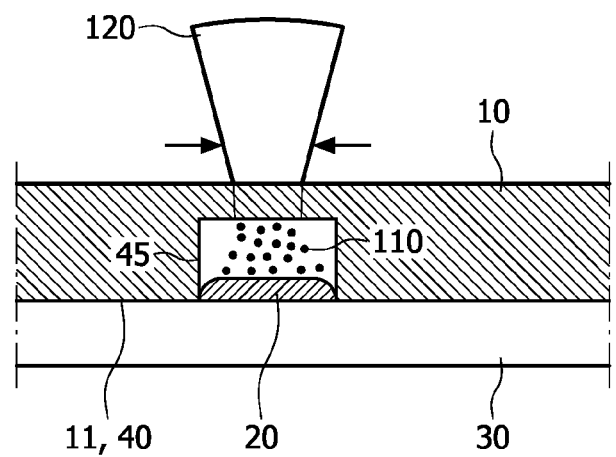

The layer 10 is/may be placed with the front side 11 on to a glass substrate 30 on which the film is to be created. A laser pulse 120 and/or a laser beam is then applied to the back of the layer 10 along the slot 45 through which the copper material of the layer 10 is transferred onto the glass substrate 30. The shape of the applied film 20, i.e. width and course in the process is defined by the shape of the slot 45 on the front 11 of the layer 10 which acts as mask 40. This is schematically shown in FIG. 3.

To form the film 20 on the substrate 30, the following steps are applied:
use a layer 10 comprises the mask 40 on a front side 11 and wherein the layer 10 and the mask 40 are one piece,
positioning the front side 11 of the layer 10 upon the substrate 30,
melting and/or evaporating and/or vaporizing of at least parts of the layer 10,
generating a shockwave 150, expanding towards the substrate 30,
formation of an internal pressure wave 155 towards the layer 10,
propelling the melt droplets 110 towards said substrate 30, and
depositing said melt droplets 110 upon said substrate 30, forming the film 20, wherein at least one slot 45 of the mask 40 limits the distribution of said melt droplets 110.

This method has the advantage that it can be carried out in ambient air. So no vacuum is required to deposit the electrically conductive film on the layer.

Figure 4:
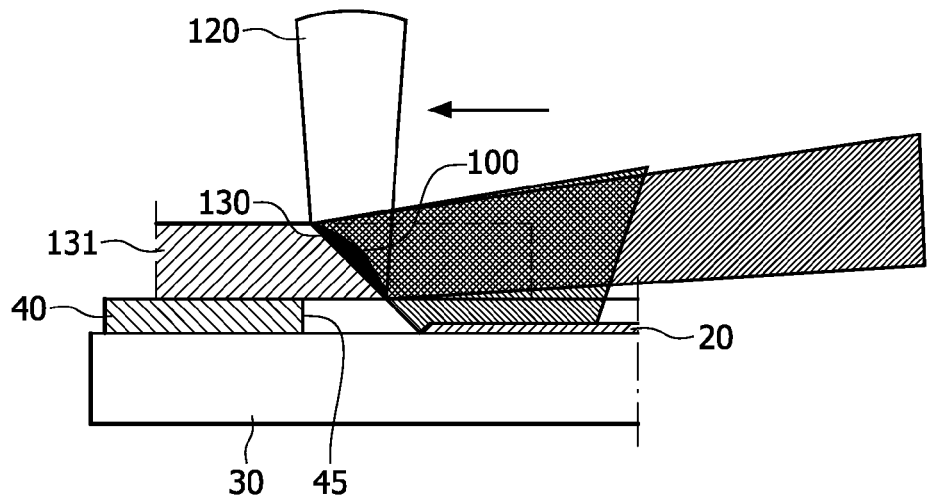

The FIG. 4 shows a cross-sectional representation of the layer 10 with the slot 45 in which the ablation process of the laser beam is evident. The laser pulse 120 is moved in the direction indicated with an arrow. Thus, a cutting edge 130 is produced on the surface of the layer 10 with suitable setting of the feed speed, the mean laser output parameters and the beam diameter which in the present example has a cutting angle θ of approximately 45°. With this cutting angle 131 the laser beam 120 does not damage the surface of the glass substrate.

Figure 5:
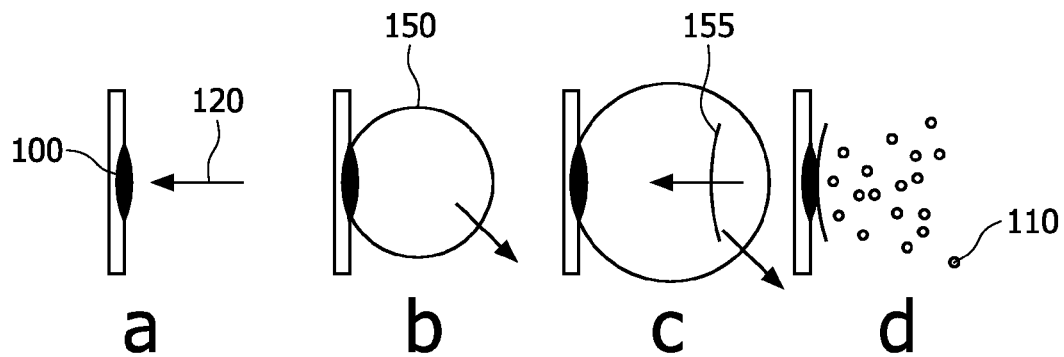

The principle of applying the film material to the glass substrate 30 is explained in more detail by means of the schematic representation of FIG. 5. The FIG. 5 depicts a cutaway of the layer 10 of FIG. 4, wherein a part parallel to the cutting edge 130 of the layer 10 is shown. The layer material 10 is melted through the introduced optical energy by the laser pulse 120 as is shown in the part—FIG. 5a. This is also shown in FIG. 4. Furthermore, the melt bath 100 surface is heated to evaporation temperature. The shockwave 150 (see FIG. 5b) emanating through the evaporated material creates a vacuum on the material surface through which a reversed pressure wave 155 is formed (FIG. 5c). If said pressure wave 155 strikes the melt bath 100, melt droplets 110 are spurting out to the surface of the layer 10 (FIG. 5d). These melt droplets 110 solidify on the substrate surface and form a conductive bond which enters into an adhesive connection with the surface of the substrate 30, to form the film 20. Through the mask 40 integrated in the layer 10 the film 20 is defined in its geometry and can be adjusted in width to <100 μm.

Figure 6:
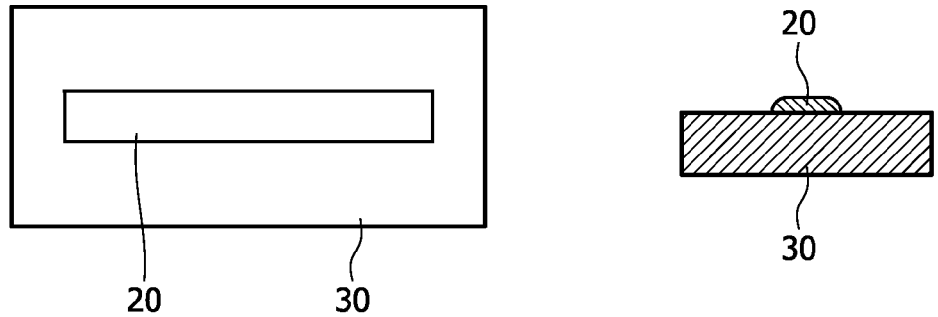

In this regard, FIG. 6 shows the deposited film 20 in top view and in cross-sectional representation. In the present example a pulsed $Nd:YVO_4$-laser with a wave length of 1064 nm and high pulse stability was employed. With setting of the mean laser output to approximately 40 Watt, the pulse repetition rate of 130 kHz and the focus of 30 μm it was possible to achieve a feed speed of 1300-1400 mm/s for producing the copper film. The resulting area resistance of the film amounted to 0.05 Ω/sq and is thus sufficient for OLED applications. If an approximately 35 μm thick aluminium layer was used, it was preferable to set the mean laser output to approximately 40 Watt and the pulse repetition rate to 150 kHz. It was possible to achieve a feed speed of 2400-2700 mm/s for producing the film.

Obviously the above mentioned parameters of the mean laser output, the pulse repetition rate, the beam diameter in the focus and the feed speed depend on the layer material, the layer thickness and under certain conditions also on the alignment of the layer material and the geometry of the mask slot.

LIST OF NUMERALS 10 layer
11 front side of layer
12 back side
20 electrically conducting film
30 substrate
40 mask
45 slot
46 slot width
100 melt bath
110 melt droplets
120 laser pulse
125 laser beam diameter
130 cutting edge
131 cutting angle
140 mechanical tool
150 shock wave
155 pressure wave

The invention claimed is:

1. A method for deposition of at least one electrically conducting film on a substrate, comprising the steps of:
selecting a layer of a film material, wherein the layer comprises a mask on a front side and wherein the layer and the mask are one piece,
positioning the front side of the layer upon the substrate,
applying at least one laser pulse onto a back side of the layer, so as to melt and to vaporize at least parts of the layer producing a plurality of melt droplets, wherein said melt droplets are propelled toward and deposited upon said substrate, forming the film, wherein at least one slot of the mask limits the distribution of said melt droplets.

2. Method according to claim 1, wherein the applying step further comprises:
melting and vaporizing of at least parts of the layer,
generating a shockwave, expanding towards the substrate,
forming an internal pressure wave towards the layer, and
propelling the melt droplets towards said substrate.

3. Method according to claim 1, wherein the shockwave is formed by a vaporized layer of the film material.

4. Method according to claim 1, wherein a plurality of laser pulses are applied sequentially and adjacent, moving along the layer above the slot.

5. Method according to claim 4, further comprising applying the laser puke to the layer forms a cutting edge, wherein the cutting edge comprises a cut angle θ of 30°≤θ≤70° relative to the back side of the layer.

6. Method according to claim 1, wherein the mask comprises a rectangular cross section.

7. Method according to claim 1, wherein a laser beam diameter on the back of the layer is adjusted in such a way that direct irradiation of the substrate is avoided.

8. Method according to claim 1, wherein the substrate is an OLED substrate.

9. Method according to claim 1, wherein the slot comprises a rectangular cross secton.

10. Method according to claim 1, wherein a laser output is adjusted in such a way that direct irradiation of the substrate is avoided.

* * * * *